US009018066B2

(12) United States Patent
Wu et al.

(10) Patent No.: US 9,018,066 B2
(45) Date of Patent: Apr. 28, 2015

(54) METHOD OF FABRICATING SEMICONDUCTOR DEVICE STRUCTURE

(71) Applicant: United Microelectronics Corp., Hsinchu (TW)

(72) Inventors: Yen-Liang Wu, Taipei (TW); Chung-Fu Chang, Tainan (TW); Yu-Hsiang Hung, Tainan (TW); Ssu-I Fu, Kaohsiung (TW); Chien-Ting Lin, Hsinchu (TW); Shih-Fang Tzou, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/042,224

(22) Filed: Sep. 30, 2013

(65) Prior Publication Data

US 2015/0093870 A1 Apr. 2, 2015

(51) Int. Cl.
| | |
|---|---|
| *H01L 21/336* | (2006.01) |
| *H01L 21/28* | (2006.01) |
| *H01L 29/66* | (2006.01) |
| *H01L 21/311* | (2006.01) |

(52) U.S. Cl.
CPC .... *H01L 21/28008* (2013.01); *H01L 29/66477* (2013.01); *H01L 21/31111* (2013.01)

(58) Field of Classification Search
CPC ............ H01L 29/1054; H01L 21/7848; H01L 21/7849
USPC ......... 438/197, 285, 510, 514, 585, 590, 595, 438/694, 700
See application file for complete search history.

(56) References Cited

U.S. PATENT DOCUMENTS

| | | | |
|---|---|---|---|
| 6,043,138 A | 3/2000 | Ibok | |
| 6,160,300 A * | 12/2000 | Gardner et al. | 257/412 |
| 6,492,216 B1 | 12/2002 | Yeo et al. | |
| 6,894,357 B2 * | 5/2005 | Guo | 257/410 |
| 6,921,963 B2 | 7/2005 | Krivokapic et al. | |
| 7,087,477 B2 | 8/2006 | Fried et al. | |
| 7,091,551 B1 | 8/2006 | Anderson et al. | |
| 7,198,993 B2 * | 4/2007 | Tigelaar et al. | 438/151 |
| 7,247,887 B2 | 7/2007 | King et al. | |
| 7,250,658 B2 | 7/2007 | Doris et al. | |
| 7,309,626 B2 | 12/2007 | Ieong et al. | |
| 7,352,034 B2 | 4/2008 | Booth, Jr. et al. | |
| 7,470,570 B2 | 12/2008 | Beintner et al. | |
| 7,531,437 B2 | 5/2009 | Brask et al. | |
| 7,569,857 B2 | 8/2009 | Simon et al. | |
| 8,236,659 B2 | 8/2012 | Tsai et al. | |
| 2004/0195624 A1 | 10/2004 | Liu et al. | |
| 2005/0051825 A1 | 3/2005 | Fujiwara et al. | |
| 2006/0099830 A1 | 5/2006 | Walther et al. | |
| 2006/0148181 A1 * | 7/2006 | Chan et al. | 438/289 |

(Continued)

*Primary Examiner* — Seahvosh Nikmanesh
(74) *Attorney, Agent, or Firm* — J.C. Patents

(57) ABSTRACT

A method of fabricating a semiconductor device structure is provided. The method includes the following step. A gate dielectric layer is formed on a substrate. A gate electrode is on the gate dielectric layer. The gate dielectric layer exposed by the gate electrode is treated. A first etching process is performed to remove at least a portion of the gate dielectric layer exposed by the gate electrode. A spacer is formed on the sidewall of the gate electrode. A second etching process is performed to form recesses in the substrate beside the gate electrode. Besides, during the first etching process and the second etching process, an etching rate of the treated gate dielectric layer is greater than an etching rate of the untreated gate dielectric layer.

14 Claims, 3 Drawing Sheets

(56) References Cited

U.S. PATENT DOCUMENTS

| | | | |
|---|---|---|---|
| 2006/0255365 A1* | 11/2006 | Ko et al. ........................ 257/192 |
| 2006/0286729 A1 | 12/2006 | Kavalieros et al. |
| 2007/0026629 A1* | 2/2007 | Chen et al. .................... 438/424 |
| 2007/0108528 A1 | 5/2007 | Anderson et al. |
| 2007/0158756 A1 | 7/2007 | Dreeskornfeld et al. |
| 2007/0224808 A1* | 9/2007 | Chang et al. .................. 438/649 |
| 2008/0157208 A1 | 7/2008 | Fischer et al. |
| 2009/0050980 A1* | 2/2009 | Ekbote et al. ................. 257/408 |
| 2009/0124097 A1 | 5/2009 | Cheng |
| 2009/0242964 A1 | 10/2009 | Akil et al. |
| 2009/0269916 A1 | 10/2009 | Kang et al. |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0167506 A1 | 7/2010 | Lin et al. |
| 2012/0032272 A1* | 2/2012 | Yoshida et al. ................ 257/369 |
| 2014/0084383 A1* | 3/2014 | Cai et al. ....................... 257/401 |
| 2014/0175527 A1* | 6/2014 | Chang et al. .................. 257/288 |

* cited by examiner

METHOD OF FABRICATING SEMICONDUCTOR DEVICE STRUCTURE

BACKGROUND OF THE INVENTION

1. Field of Invention

This invention is related to a semiconductor process, and particularly to a method of fabricating a semiconductor device structure.

2. Description of Related Art

MOS is a basic structure widely applied to various semiconductor devices, such as memory devices, image sensors and display devices. The traditional MOS transistor is difficult to scale down due to the limitation of the fabricating process, and strained source/drain is therefore developed. In the strained source/drain process, a single etching process is performed to form recesses beside the gate electrode, and a semiconductor compound having a lattice parameter different from that of the material of the substrate is grown in the recesses.

However, since a longer time is required to etch the thick gate dielectric layer, the gate dielectric layer under the gate electrode may be etched in the lateral direction. Therefore, an undercut is observed in the gate dielectric layer under the gate electrode. As a result, the semiconductor compound may contact with the gate electrode to cause a short circuit and the process margin can be decreased.

SUMMARY OF THE INVENTION

In view of the foregoing, this invention provides a method of fabricating a semiconductor device structure so as to prevent undercut from being formed in the gate dielectric layer under the gate electrode.

A method of fabricating a semiconductor device structure is provided. The method includes the following step. A gate dielectric layer is formed on a substrate. A gate electrode is on the gate dielectric layer. The gate dielectric layer exposed by the gate electrode is treated. A first etching process is performed to remove at least a portion of the gate dielectric layer exposed by the gate electrode. A spacer is formed on the sidewall of the gate electrode. A second etching process is performed to form recesses in the substrate beside the gate electrode. Besides, during the first etching process and the second etching process, an etching rate of the treated gate dielectric layer is greater than an etching rate of the untreated gate dielectric layer.

In an embodiment of the invention, the treating includes performing an implant process with boron or carbon.

In an embodiment of the invention, the first etching process is performed to thin the gate dielectric layer exposed by the gate electrode In an embodiment of the invention, a thickness of the thinned gate dielectric layer is less than 15 Å.

In an embodiment of the invention, a thickness of the thinned gate dielectric layer is ranged form 5 to 15 Å.

In an embodiment of the invention, the first etching process is performed to expose the substrate.

In an embodiment of the invention, the step of performing the first etching process includes performing a dry etching process, a wet etching process, or a combination thereof.

In an embodiment of the invention, the method further includes forming a patterned hard mask layer on the gate electrode.

In an embodiment of the invention, the patterned hard mask layer includes a multi-layer structure.

In an embodiment of the invention, the multi-layer structure includes, from bottom to top, a first hard mask layer, a second hard mask layer and a third hard mask layer.

In an embodiment of the invention, a material of the third hard mask layer is different from a material of the gate dielectric layer.

In an embodiment of the invention, the first hard mask layer, the second hard mask layer and the third hard mask layer comprise silicon nitride, silicon oxide and silicon nitride, respectively.

In an embodiment of the invention, the step of forming the gate electrode and the step of forming the patterned hard mask layer includes the following steps. A conductive layer is formed on the gate dielectric layer. A hard mask layer is formed on the conductive layer. The hard mask layer and the conductive layer are patterned to form the patterned hard mask layer and the gate electrode.

In an embodiment of the invention, the method further comprises forming a semiconductor compound in the recesses.

In an embodiment of the invention, the semiconductor compound includes SiGe or SiP.

In an embodiment of the invention, the method of forming the semiconductor compound includes an epitaxial process.

In the method of this invention, since the gate dielectric layer exposed by the gate electrode is treated before the recesses are formed in the substrate, and thus the etching rate of the treated gate dielectric layer is greater than the etching rate of the untreated gate dielectric layer. Therefore, the gate dielectric layer covered by the gate electrode can remain substantially intact without undercut during the first and second etching process. Moreover, it is easy and simple to integrate the method of the invention into the existing CMOS process, thereby achieving competitive advantages over competitors.

In order to make the aforementioned and other objects, features and advantages of the present invention comprehensible, a preferred embodiment accompanied with figures is described in detail below.

DESCRIPTION OF EMBODIMENTS

FIG. 1A to FIG. 1G are schematic cross-sectional views illustrating a method of forming a semiconductor device structure according to an embodiment of the present invention.

Figure 1A:
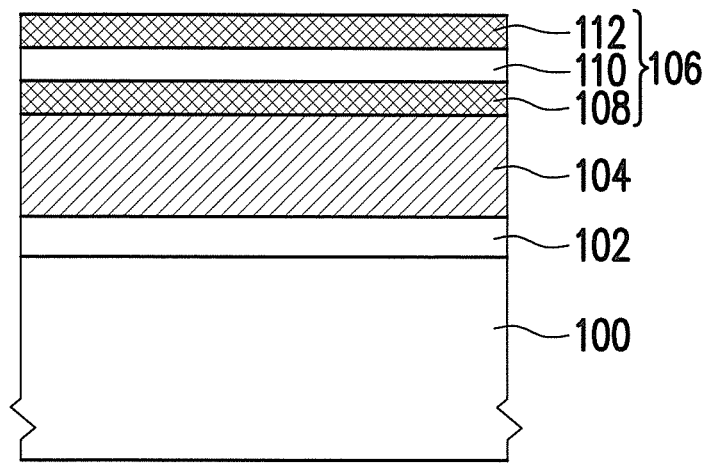
FIG. 1A to FIG. 1G are schematic cross-sectional views illustrating a method of forming a semiconductor device structure according to an embodiment of the present invention.

Referring to FIG. 1A, a substrate 100 is provided. The substrate 100 can be a semiconductor substrate, such as a silicon substrate. At least one shallow trench isolation (STI) structure (not shown) is formed in the substrate 100 for providing electrical isolation.

A gate dielectric layer 102 is formed on the surface of the substrate 100, and the gate dielectric layer 102 may include silicon oxide or silicon oxynitride, silicon nitride, or a high-k material (i.e. a dielectric material with a dielectric constant greater than 4). The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The gate dielectric layer 102 can be formed by a furnace process, a deposition process such as a chemical vapor deposition (CVD) or an atomic layer deposition (ALD) process, or a spin coating process. The thickness of the gate dielectric layer 102 may range from 50 to 70 Å.

Thereafter, a conductive layer 104 is foinied over the gate dielectric layer 102. In an embodiment, the conductive layer 104 includes a polycrystalline silicon (polysilicon) layer. The polysilicon layer can be doped or undoped. In another embodiment, the conductive layer 104 may include a work function layer and a low-resistivity metal material layer on the work function layer. For a P-type device, the work function metal layer includes titanium nitride (TiN), titanium carbide (TiC), tantalum nitride (TaN), tantalum carbide (TaC), tungsten carbide (WC) or aluminum titanium nitride (TiAlN). For an N-type device, the work function metal layer includes titanium aluminide (TiAl), zirconium aluminide (ZrAl), tungsten aluminide (WAl), tantalum aluminide (TaAl) or hafnium aluminide (HfAl). The method of forming the work function layer includes performing a radio frequency PVD (RFPVD) process. The low-resistivity metal material layer includes W, Al, Cu or an alloy thereof, or a combination thereof, and the forming method thereof includes performing a deposition process such as PVD or CVD.

A hard mask layer 106 is formed over the conductive layer 104. The hard mask layer 106 may be a multi-layer structure. In an embodiment, the hard mask layer 106 includes, from bottom to top, a first hard mask layer 108, a second hard mask layer 110, and a third hard mask layer 112. The first hard mask layer 108 and the second hard mask layer 110 include different materials, for example, silicon nitride and silicon oxide, respectively, while the second hard mask layer 110 and the third hard mask layer 112 include different materials, for example, silicon oxide and silicon nitride, respectively. In addition, the third hard mask layer 112 and the gate dielectric layer 102 include different materials, for example, silicon nitride and silicon oxide, respectively. However, the materials of the hard mask layer 106 are not limited thereto, and may include other dielectric materials such as silicon oxynitirde, silicon carbide, or other suitable dielectric material, or combinations thereof. The forming method of the hard mask layer 106 includes performing a deposition process such as PVD or CVD. The thicknesses of the first hard mask layer 108, the second hard mask layer 110, and the third hard mask layer 112 may range from 200 to 600 Å, from 400 to 600 Å, and from 100 to 300 Å, respectively.

Figure 1B:
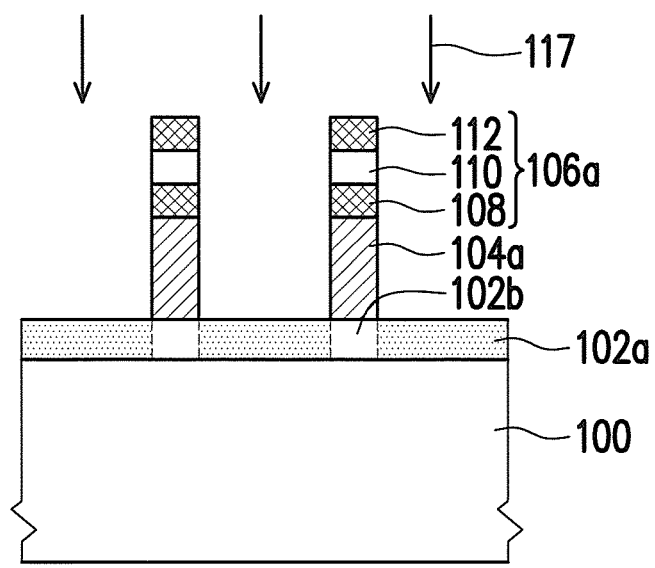

Referring to FIG. 1B, the hard mask layer 106 and the conductive layer 104 may be patterned to form gate structures 116 by a lithography process and an etching process, for example. Each of the gate structures 116 includes a patterned hard mask layer 106a and a gate electrode 104a.

Referring to FIG. 1B, a treatment step 117 is performed to the gate dielectric layer exposed by gate dielectric layer 102. The treatment step 117 includes performing an implant process with carbon or boron, for example. After the treatment step 117, the etching rate of the treated gate dielectric layer 102a exposed by the patterned hard mask layers 106a is greater than the etching rate of the untreated gate dielectric layer 102b covered by the patterned hard mask layers 106a.

Figure 1C:
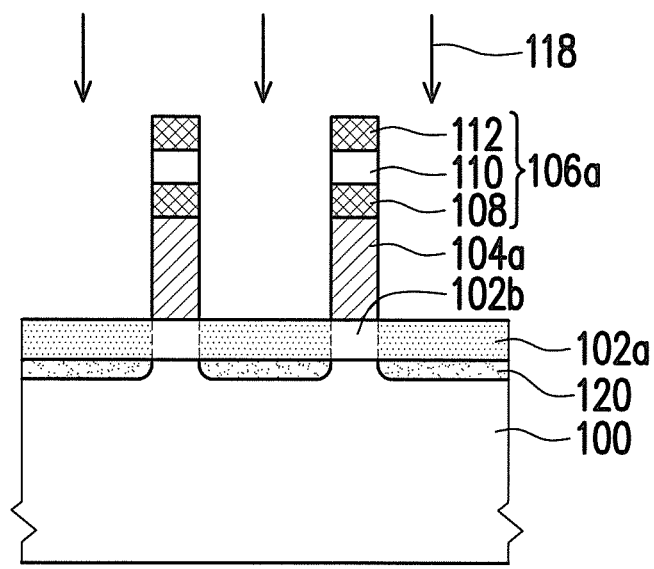

Referring to FIG. 1C, at least an implant process 118 is then performed to the substrate 100 so as to form S/D extension regions 120. In an embodiment, the implant process 118 may include an N-type S/D extension implant step that forms S/D extension regions of the NMOS devices, or include an N-type S/D extension implant step and a P-type pocket implant step (the P-type pocket doped regions are not shown). In an other embodiment, the implant process 116 may include a P-type S/D extension implant step that foams S/D extension regions of the PMOS devices, or include a P-type S/D extension implant step and an N-type pocket implant step (the N-type pocket doped regions are not shown).

Figure 1D:
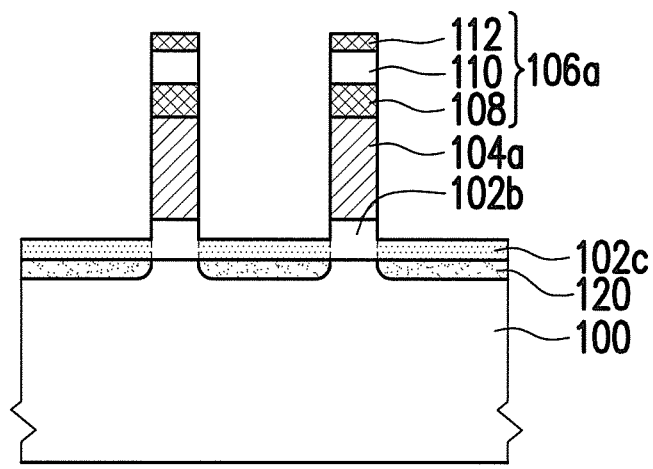

Referring to FIG. 1D, a first etching process is performed to remove at least a portion of the gate dielectric layer 102a, so as to thin the gate dielectric layer 102a and therefore form a thinned gate dielectric layer 102c. Besides, a portion of the third hard mask layer 112 may be simultaneously removed during the first etching process. The thickness of the thinned gate dielectric layer 102c may be less than 15 Å. In an embodiment, the thickness of the thinned gate dielectric layer 102c may range from 5 Å to 15 Å. The first etching process may be a dry etching process, a wet etching process or a combination thereof. The dry etching process or the wet etching process has etching parameters that can be tuned such as etchants used, etching temperature, etching solution concentration, etching pressure, source power, RF bias voltage, etchant flow rate, and other suitable parameters. For example, the recipe of the dry etching process may include an etching gas that includes $CF_4$, $Cl_2$ or a combination thereof. The recipe of the wet etching process may include an etchant that includes diluted hydrofluoric acid (HF). In another embodiment, upon the process requirements, the first etching process may be performed to remove the entirety of the gate dielectric layer 102a so as to expose the substrate 100.

Since the treated gate dielectric layer 102a has a higher etching rate than that of the untreated gate dielectric layer 102b, the untreated gate dielectric layer 102b remains substantially intact after the first etching process. Thus, the conventional undercut is not observed during the first etching process. In addition, the first etching process can be considered a self-aligned step by using the patterned hard mask layers 106a as a mask.

Figure 1E:
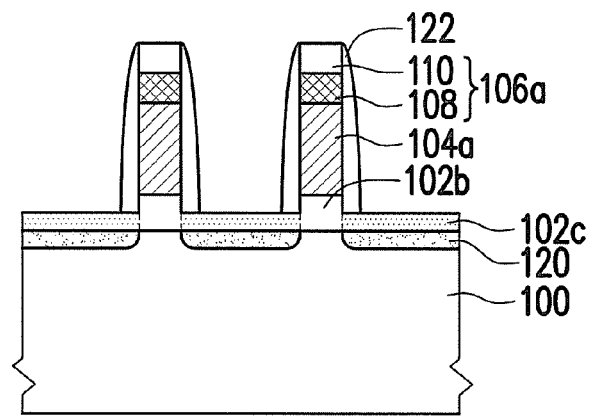

Thereafter, referring to FIG. 1E, a spacer 122 is formed on the sidewall of each gate structure 116 and on the sidewall of the gate dielectric layer 102b. The material of the spacer 122 is different from that of the thinned gate dielectric layer 102c. The spacers 122 may include silicon oxide, silicon nitride, silicon oxynitride or a combination thereof. The method of forming the spacers 122 includes depositing a spacer material layer on the substrate 100, and then performing an anisotropic etching process to the spacer material layer.

Figure 1F:
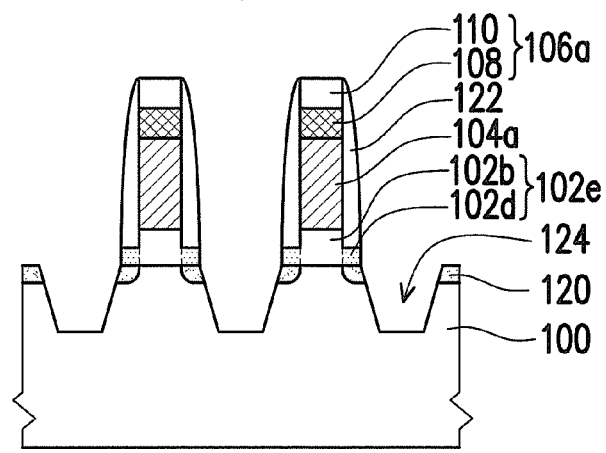

Referring to FIG. 1F, by using the spacers 122 and the gate structures 116 as a mask layer, a second etching process is performed to remove the thinned gate dielectric layer 102c and a portion of the substrate 100 and therefore form a gate dielectric layer 102d and to form recesses 124 in the substrate 100 beside the gate structures 116. Besides, the third hard mask layer 112 may be simultaneously removed during the second etching process. Since the thinned gate dielectric layer 102c thin enough, it may be easily removed during the second etching process in a short time. Thus, the conventional undercut is not found during the second etching process. Further, the gate dielectric layer 102b is surrounded by the thinned gate dielectric layer 102c and the etching rate of the gate dielectric layer 102b is lower than the etching rate of the thinned gate dielectric layer 102c, so that the gate dielectric layer 102b is not subjected to a lateral etching during the second etching process.

Figure 1G:
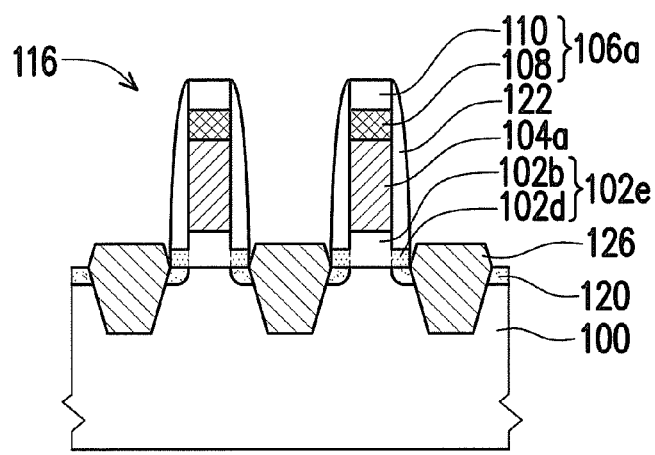

Referring to FIG. 1G, a semiconductor compound 126 is formed in the recesses 124. In an embodiment, for the PMOS devices, the semiconductor compound 126 may include SiGe, and may be formed by an epitaxial process with in-situ P-type doping. In another embodiment, for the NMOS devices, the semiconductor compound 126 may include silicon phosphorous (SiP), and may be formed by an epitaxial process with in-situ N-type doping.

Referring to FIG. 1G, the semiconductor device structure 200 of this invention includes at least one gate structure 116 disposed over the substrate 100 and a spacer 122 on the sidewall of the gate structure 116. The gate structure 116 includes, from bottom to top, a dielectric layer 102e, a gate electrode 104a, and a patterned hard mask layer 106a. In an embodiment, the dielectric layer 102e includes a gate dielectric layer 102d and a gate dielectric layer 102b. The gate dielectric layer 102b is positioned under the gate electrode 104a, while the gate dielectric layer 102d is positioned under the spacer 122. The gate dielectric layer 102b is surrounded by the gate dielectric layer 102d, and the thickness of the gate dielectric layer 102b is greater than the thickness of the gate dielectric layer 102d. In other words, the dielectric layer 102e has a reverse-T shape. The patterned hard mask layer 106a includes the first hard mask layer 108 and the second hard mask layer 110. The first hard mask layer 108 and the second hard mask layer 110 include different materials.

The semiconductor device structure further includes S/D extension regions 120 in the substrate 100 beside the gate structure 116 and the semiconductor compound 126 in recesses 124 in the substrate 100 adjacent to the S/D extension regions 120.

In view of the above, the gate dielectric layer 102b under the gate electrode 104a is surrounded by the gate dielectric layer 102d under the spacer 122 and no undercut is found in the gate dielectric layer 102b. Therefore, the conventional short circuit between the semiconductor compound 126 and the gate electrode 104a does not occur.

In summary, in the present invention, since the gate dielectric layer exposed by the gate electrode is treated before the recesses are foamed in the substrate, and thus the etching rate of the treated gate dielectric layer is greater than the etching rate of the untreated gate dielectric layer. Therefore, the gate dielectric layer covered by the gate electrode can remain substantially intact without undercut during the first etching process.

Further, in an embodiment, the gate dielectric layer covered by the gate electrode is surrounded by the gate dielectric layer under the spacer, and no undercut is found in the gate dielectric layer covered by the gate electrode. In the case that undercuts are not present in the gate dielectric layer, the conventional short circuit between the semiconductor compound and the gate electrode does not occur and the device performance is accordingly improved. In addition, it is easy and simple to integrate the method of the invention into the existing CMOS process, thereby achieving competitive advantages over competitors.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating a semiconductor device structure, comprising:
    forming a gate dielectric layer on a substrate;
    forming a gate electrode on the gate dielectric layer;
    treating the gate dielectric layer exposed by the gate electrode;
    performing a first etching process to remove at least a portion of the gate dielectric layer exposed by the gate electrode, wherein a portion of the gate dielectric layer is remained on the substrate not covered by the gate electrode to form a thinned gate dielectric layer;
    forming a spacer on a sidewall of the gate electrode;
    performing a second etching process to remove a portion of the thinned gate dielectric layer and a portion of the substrate so as to form recesses in the substrate beside the gate electrode,
    wherein during the first etching process and the second etching process, an etching rate of a treated gate dielectric layer is greater than an etching rate of an untreated gate dielectric layer.

2. The method of claim 1, wherein the treating comprises performing an implant process with boron or carbon.

3. The method of claim 1, wherein a thickness of the thinned gate dielectric layer is less than 15 Å.

4. The method of claim 3, wherein the thickness of the thinned gate dielectric layer is ranged from 5 Å to 15 Å.

5. The method of claim 1, wherein the step of performing the first etching process comprises performing a dry etching process, a wet etching process, or a combination thereof.

6. The method of claim 1, further comprising forming a patterned hard mask layer on the gate electrode.

7. The method of claim 6, wherein the patterned hard mask layer comprises a multi-layer structure.

8. The method of claim 7, wherein the multi-layer structure comprises, form bottom to top, a first hard mask layer, a second hard mask layer and a third hard mask layer.

9. The method of claim 8, wherein a material of the third hard mask layer is different from a material of the gate dielectric layer.

10. The method of claim 8, wherein the first hard mask layer, the second hard mask layer and the third hard mask layer comprise silicon nitride, silicon oxide and silicon nitride, respectively.

11. The method of claim 6, wherein the step of forming the gate electrode and the step of forming the patterned hard mask layer comprise:
    forming a conductive layer on the gate dielectric layer;
    forming a hard mask layer on the conductive layer; and
    patterning the hard mask layer and the conductive layer to form the patterned hard mask layer and the gate electrode.

12. The method of claim 1, further comprising forming a semiconductor compound in the recesses.

13. The method of claim 12, wherein the semiconductor compound comprises SiGe or SiP.

14. The method of claim 13, wherein a method of forming the semiconductor compound comprises an epitaxial process.

* * * * *